United States Patent
Bal et al.

(10) Patent No.: US 12,088,326 B2
(45) Date of Patent: Sep. 10, 2024

(54) SIGMA-DELTA ANALOG-TO-DIGITAL CONVERTER CIRCUIT WITH DATA SHARING FOR POWER SAVING

(71) Applicant: STMicroelectronics International N.V., Geneva (CH)

(72) Inventors: Ankur Bal, Greater Noida (IN); Abhishek Jain, Delhi (IN)

(73) Assignee: STMicroelectronics International N.V., Geneva (CH)

( * ) Notice: Subject to any disclaimer, the term of this patent is extended or adjusted under 35 U.S.C. 154(b) by 187 days.

(21) Appl. No.: 17/940,236

(22) Filed: Sep. 8, 2022

(65) Prior Publication Data

US 2023/0099514 A1   Mar. 30, 2023

Related U.S. Application Data

(60) Provisional application No. 63/247,896, filed on Sep. 24, 2021.

(51) Int. Cl.
    *H03M 3/00*    (2006.01)
    *H03K 3/356*   (2006.01)
    *H03M 1/06*    (2006.01)

(52) U.S. Cl.
    CPC ............ *H03M 3/464* (2013.01); *H03K 3/356* (2013.01); *H03M 1/0626* (2013.01); *H03M 3/43* (2013.01)

(58) Field of Classification Search
    CPC ....... H03M 3/464; H03M 1/0626; H03M 3/43
    USPC ......................................... 341/144, 155, 143
    See application file for complete search history.

(56) References Cited

U.S. PATENT DOCUMENTS

| | | | |
|---|---|---|---|
| 4,746,899 A * | 5/1988 | Swanson ............... | H03M 3/324 341/122 |
| 5,825,253 A | 10/1998 | Mathe et al. | |
| 6,184,812 B1 | 2/2001 | Younis et al. | |
| 6,356,129 B1 | 3/2002 | O'Brien et al. | |

(Continued)

FOREIGN PATENT DOCUMENTS

EP   3182595 A1   6/2017

OTHER PUBLICATIONS

Petrie C et al "A Background Calibration Technique for Multibit Delta-Sigma Modulators" Circuits and Systems 2000 Proceedings ISCAS 2000 Geneva The 2000 IEEE International Symposium on May 28-31, 2000 Piscataway NY USA vol. 2 May 28, 2000 pp. 29-32.

(Continued)

*Primary Examiner* — Peguy Jean Pierre
(74) *Attorney, Agent, or Firm* — Crowe & Dunlevy LLC

(57) ABSTRACT

A continuous time, sigma-delta analog-to-digital converter circuit includes a sigma-delta modulator circuit configured to receive an analog input signal. A single bit quantizer of the modulator generates a digital output signal at a sampling frequency. A data storage circuit stores bits of the digital output signal and digital-to-analog converter (DAC) elements are actuated in response to the stored bits to generate an analog feedback signal for comparison to the analog input signal. A filter circuit includes polyphase signal processing paths and a summation circuit configured to sum outputs from the polyphase signal processing paths to generate a converted output signal. A fan out circuit selectively applies the stored bits from the data storage circuit to inputs of the polyphase signal processing paths of the filter circuit.

20 Claims, 3 Drawing Sheets

(56) References Cited

U.S. PATENT DOCUMENTS

| | | |
|---|---|---|
| 6,606,004 B2 | 8/2003 | Staszewski et al. |
| 7,030,792 B2 | 4/2006 | Chen |
| 7,053,808 B2 | 5/2006 | Chen |
| 7,151,474 B2 | 12/2006 | Ortmanns et al. |
| 7,271,666 B1 | 9/2007 | Melanson |
| 7,362,247 B2 | 4/2008 | Arias et al. |
| 7,487,055 B2 | 2/2009 | Le-Gall |
| 7,522,690 B2 | 4/2009 | Zhang |
| 7,626,527 B1 | 12/2009 | Wang et al. |
| 7,852,249 B2 | 12/2010 | Oliaei |
| 7,994,957 B2 | 8/2011 | O'Donnell et al. |
| 8,018,365 B1 | 9/2011 | Tsai |
| 8,164,500 B2 | 4/2012 | Ahmed et al. |
| 8,169,352 B2 | 5/2012 | Sorin et al. |
| 8,542,138 B2 | 9/2013 | Galton et al. |
| 8,860,478 B2 | 10/2014 | Chen et al. |
| 9,203,426 B2 | 12/2015 | Zhao et al. |
| 9,438,266 B1 | 9/2016 | Nagaraj et al. |
| 9,564,916 B2 | 2/2017 | Bandyopadhyay |
| 9,716,509 B2 | 7/2017 | Zhao |
| 9,735,797 B2 | 8/2017 | Zhao et al. |
| 10,148,278 B2 | 12/2018 | Bresciani et al. |
| 10,425,100 B1 | 9/2019 | Vaturi |
| 10,664,098 B2 | 5/2020 | Gray et al. |
| 10,862,503 B2 | 12/2020 | Bal et al. |
| 11,043,960 B2 | 6/2021 | Bal et al. |
| 2006/0056561 A1 | 3/2006 | Zhang |
| 2007/0164884 A1 | 7/2007 | Ihs |
| 2008/0025383 A1 | 1/2008 | Li |
| 2010/0156686 A1 | 6/2010 | Kim et al. |
| 2011/0037631 A1 | 2/2011 | Lai et al. |
| 2011/0182389 A1 | 7/2011 | Breems et al. |
| 2012/0188107 A1* | 7/2012 | Ashburn, Jr. .......... H03M 3/344 341/110 |
| 2012/0194369 A1 | 8/2012 | Galton et al. |
| 2014/0070969 A1 | 3/2014 | Shu |
| 2014/0368367 A1 | 12/2014 | Choi et al. |
| 2015/0341046 A1* | 11/2015 | Schinkel ................ H03F 3/181 341/110 |
| 2019/0173479 A1 | 6/2019 | Dyachenko et al. |
| 2020/0186162 A1 | 6/2020 | Bal et al. |

OTHER PUBLICATIONS

Tortosa, et al: "Effect of Clock Jitter Error on the Performance Degradation of Multi-bit Continuous-Time ΣΔ Modulators With NRZ DAC," TEC2004-01752/MIC Jan. 2005 (6 pages).

Rashidzadeh, et al: "An All-Digital Self-Calibration Method for a Vernier-Based Time-to-Digital Converter," IEEE Transactions on Instrumentation and Measurement, vol. 59, No. 2, Feb. 2010, pp. 463-469.

Lee, et al: "A Low Noise, Wideband Digital Phase-Locked Loop Based on a New Time-to-Digital Converter With Subpicosecond Resolution," 2008 Symposium on VLSI Circuits Digest of Technocal Papers, 2008 IEEE, pp. 112-113.

Lee, et al: "A 9 b, 1.25 ps Resolution Coarse-Fine Time-to-Digital Converter in 90 nm CMOS that Amplifies Time Residue," IEEE Journal of Solid-State Circuits, vol. 43, No. 4, Apr. 2008, pp. 769-777.

Hsu et al: "BIST for Measuring Clock Jitter of Charge-Pump Phase-Locked Loops," IEEE Transactions on Instrumentation and Measurement, vol. 57, No. 2, Feb. 2008 (pp. 276-285).

Hashimoto, et al: "Time-to-Digital Converter With Vernier Delay Mismatch Compensation for High Resolution On-Die Clock Jitter Measurement," 2008 Symposium on VLSI Circuits Digest of Technical Papers, 2008 IEEE, pp. 166-167.

Nose, et al: "A 1-ps Resolution Jitter-Measurement Macro Using Interpolated Jitter Oversampling," IEEE Journal of Solid-State Circuits, vol. 41, No. 12, Dec. 2006, pp. 2911-2920.

A.H. Chan, G.W. Robert, "A Jitter Characterization System Using a Component-Invariant Vernier Delay Line", IEEE Transaction on Very Large Scale Integration Systems, vol. 12, No. 1, Jan. 2004.

Xia, et al: "On-Chip Jitter Measurement for Phase Locked Loops," Proceedings of the 17th IEEE International Symposium on Defect and Fault Tolerance in VLSI Systems (DFT'02), 2002 IEEE (9 pages).

Moon, et al: "Spectral Analysis of Time-Domain Phase Jitter Measurements," IEEE Transactions on Circuits and Systems—II: Analog and Digital Signal Processing, vol. 49, No. 5, May 2002, pp. 321-327.

Dubois, et al: "Ternary Stimulus for Fully Digital Dynamic Testing of SC ΣΔ ADCs," 2012 IEEE 18th International Mixed-Signal, Sensors, and Systems Test Workshop, 2012 IEEE, pp. 5-10.

Rolindez, et al: "A SNDR BIST for ΣΔ Analogue-to-Digital Converters," Proceedings of the 24th IEEE VLSI Test Symposium (VTS'06), 2006 IEEE (6 pages).

* cited by examiner

SIGMA-DELTA ANALOG-TO-DIGITAL CONVERTER CIRCUIT WITH DATA SHARING FOR POWER SAVING

CROSS REFERENCE TO RELATED APPLICATIONS

This application claims priority from U.S. Provisional Application for Patent No. 63/247,896, filed Sep. 24, 2021, the disclosure of which is incorporated by reference.

TECHNICAL FIELD

Embodiments generally relate to an analog-to-digital converter circuit and, in particular, to a sigma-delta analog-to-digital converter circuit.

BACKGROUND

Continuous time (CT) sigma-delta ($\Sigma\Delta$) modulators operate to efficiently digitize a wide variety of analog signals. These modulators are suitable for use in a number of different applications. Because of their tolerance to component mismatch, the use of an easy to drive input circuit structure, as well as intrinsic anti-aliasing filtering and noise shaping abilities, CT$\Sigma\Delta$ modulators have become the circuit of choice for many designers needing a high dynamic range, moderate to wide bandwidth data converter. Indeed, this choice is even more attractive with the recent advances providing faster CMOS technologies along with design innovations such as better architectures and faster amplifiers. In this environment, CT$\Sigma\Delta$ modulators now offer the best of both worlds with high resolution and high bandwidth.

Those skilled in the art recognize that high performance CT$\Sigma\Delta$ analog-to-digital converters (ADCs) do suffer from performance degradation due to feedback digital-to-analog converter (DAC) mismatch. So, if it is possible, the designer would prefer the use of a single bit quantization and a single bit DAC in the feedback loop which provides for an inherent linearity.

It is also recognized that the CT$\Sigma\Delta$ modulator will typically, and preferably, operate at a very high frequency. As a result, there is a significant power dissipation in both the analog circuit parts and digital circuit parts. As performance metrics improve, this power dissipation exponentially increases with any increase in the quantizer sampling frequency. Additionally, it becomes increasingly challenging to design the required higher complexity digital circuit and analog-digital interfaces at these higher data rates.

There is accordingly a need to address the foregoing and other problems associated with high-speed high-performance CT$\Sigma\Delta$ analog-to-digital converters.

SUMMARY

In an embodiment, a continuous time, sigma-delta analog-to-digital converter circuit comprises: a sigma-delta modulator circuit configured to receive an analog input signal and including a single bit quantizer configured to generate a digital output signal at a sampling frequency and further including a single bit digital-to-analog converter (DAC) circuit configured to process the digital output signal to generate an analog feedback signal for comparison to the analog input signal; wherein the single bit digital-to-analog converter circuit comprises: a plurality of flip-flops coupled in series and configured to store bits of the digital output signal; and a plurality of single DAC elements controlled by the stored bits of the digital output signal output from said plurality of flip-flops; a polyphase filter circuit including a plurality of signal processing paths, wherein each signal processing path includes a polyphase filter bank and wherein outputs from the plurality of signal processing paths are summed to generate a converted output signal; and a fan out circuit configured to selectively apply bits of the digital output signal output from the plurality of flip-flops to inputs of the plurality of signal processing paths of the polyphase filter circuit.

In an embodiment, a continuous time, sigma-delta analog-to-digital converter circuit comprises: a sigma-delta modulator circuit configured to receive an analog input signal and including: a single bit quantizer configured to generate a digital output signal at a sampling frequency; a data storage circuit configured to store bits of the digital output signal; and a plurality of digital-to-analog converter (DAC) elements coupled to the data storage circuit and actuated in response to the stored bits to generate an analog feedback signal for comparison to the analog input signal; a filter circuit including a plurality of polyphase signal processing paths and a summation circuit configured to sum outputs from the plurality of polyphase signal processing paths to generate a converted output signal; and a fan out circuit configured to selectively apply the stored bits from the data storage circuit to inputs of the plurality of polyphase signal processing paths of the filter circuit.

BRIEF DESCRIPTION OF THE DRAWINGS

For a better understanding of the embodiments, reference will now be made by way of example only to the accompanying figures in which.

DETAILED DESCRIPTION

Figure 1:
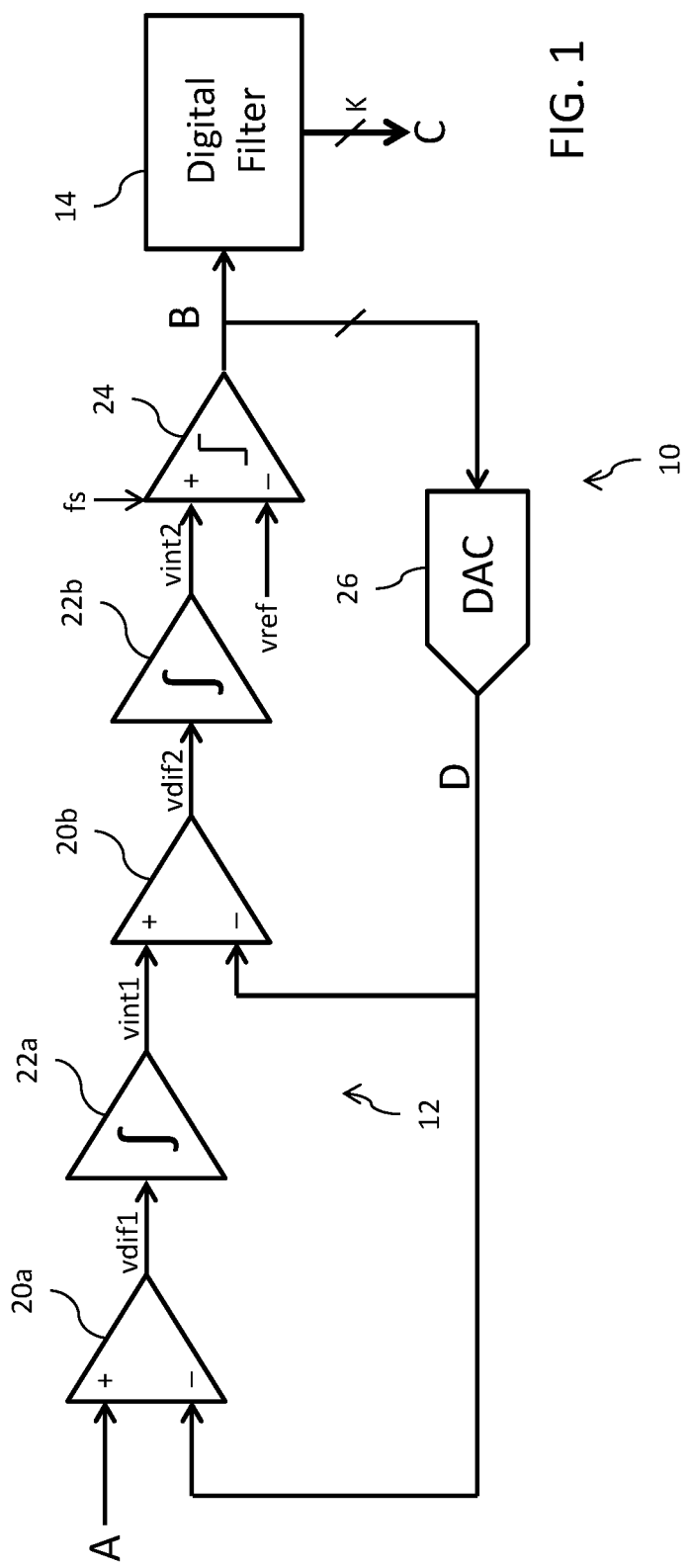
FIG. 1 is a block diagram of a sigma-delta analog-to-digital converter circuit with single bit quantization.

FIG. 1 shows a time domain block diagram of a sigma-delta analog-to-digital converter circuit 10. The circuit 10 includes a second order (by example only) sigma-delta modulator circuit 12 having an input configured to receive an analog input signal A and an output configured to generate a digital output signal B comprised of a pulse density modulated pulse stream of 1-bit codes. The ratio formed by a count of the number of pulses in the pulse stream of the signal B divided by a total number of samples (set by a sampling rate fs) of the input signal A over a known time interval represents the instantaneous magnitude of the input signal A. The circuit 10 further includes a digital filter circuit 14 that decimates and filters the pulses in the pulse stream of the digital output signal B to generate a K-bit digital signal C having a value corresponding to the analog input signal magnitude.

The second order sigma-delta modulator circuit 12 comprises a first difference amplifier 20a (or summation circuit) having a first (non-inverting) input that receives the analog input signal A and a second (inverting) input that receives an analog feedback signal D. The first difference amplifier 20a outputs a first analog difference signal vdif1 in response to a difference between the analog input signal A and the analog feedback signal D (i.e., vdif1(t)=A(t)−D(t)). The first analog difference signal vdif1 is integrated by a first integrator circuit 22a to generate a first integrated signal vint1 having a slope and magnitude that is dependent on the sign and magnitude of the first analog difference signal vdif1. The second order sigma-delta modulator circuit 12 further comprises a second difference amplifier 20b (or summation circuit) having a first (non-inverting) input that receives the first integrated signal vint1 and a second (inverting) input that receives the analog feedback signal D. The second difference amplifier 20b outputs a second analog difference signal vdif2 in response to a difference between the first integrated signal vint1 and the analog feedback signal D (i.e., vdif1(t)=vint1(t)−D(t)). The second analog difference signal vdif2 is integrated by a second integrator circuit 22b to generate a second integrated signal vint2 having a slope and magnitude that is dependent on the sign and magnitude of the second analog difference signal vdif2. A voltage comparator circuit 24 samples the second integrated signal vint2 in response to a sampling clock at the sampling rate fs and compares each sample of the second integrated signal vint2 to a reference signal vref to generate a corresponding single bit pulse of the digital output signal B (where the single bit has a first logic state if vint2≥vref and has a second logic state if vint2<vref). The voltage comparator circuit 24 effectively operates as a single bit quantization circuit. A single bit digital-to-analog converter (DAC) circuit 26 in a feedback loop then converts the logic state of the digital output signal B to a corresponding analog voltage level for the analog feedback signal D.

A key characteristic of the sigma-delta modulator circuit 12 is its ability to push quantization noise due to operation of the quantization circuit 24 to higher frequencies away from the signal of interest. This is known in the art as noise shaping. The digital filter circuit 14 can then be implemented with a low-pass filtering characteristic to substantially remove the high frequency components of the shaped quantization noise.

Figure 2:
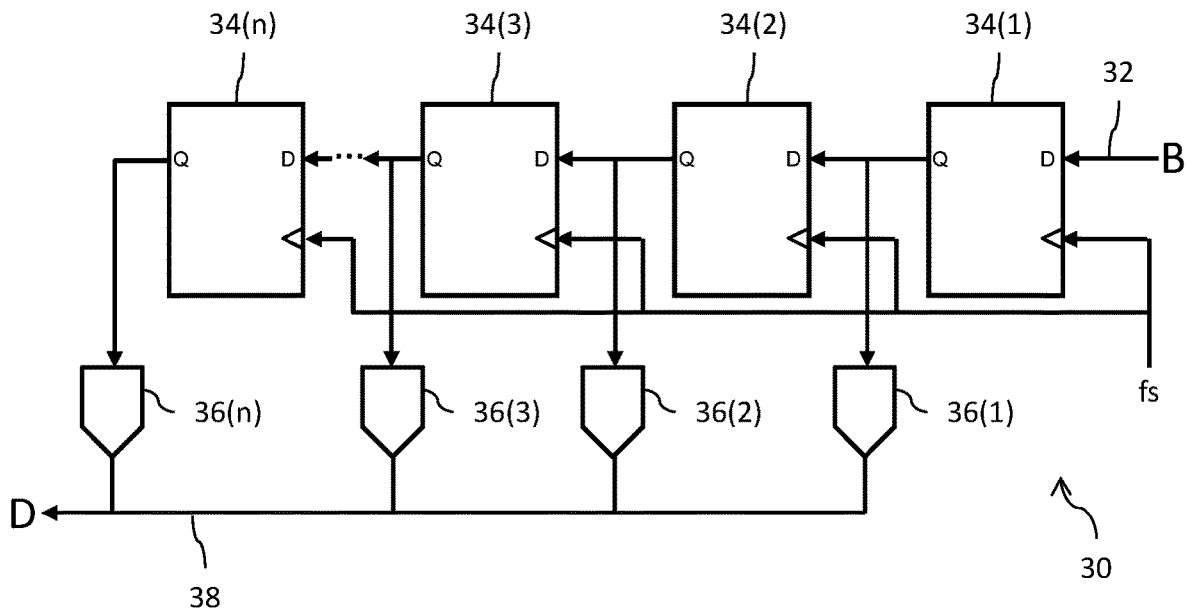
FIG. 2 is a block diagram of a single bit finite impulse response digital-to-analog converter for the circuit of FIG. 1.

Reference is now made to FIG. 2 which shows a block diagram of a single bit finite impulse response (FIR) digital-to-analog converter (DAC) circuit 30 for use as the single bit DAC circuit 26 in the feedback loop of the circuit shown in FIG. 1. The FIR DAC circuit 30 includes an input 32 configured to receive the sequence of bits of the digital output signal B from the quantizer circuit 24. A plurality of flip-flop circuits 34(1)-34(n) are cascaded in series and clocked by the sampling clock at the sampling rate fs. The data input (D) of a first flip-flop circuit 34(1) is coupled to the input 32 and a data output (Q) of the first flip-flop circuit 34(1) is coupled to the data input of the second flip-flop circuit 34(2). This series coupling of flip-flop output to input is repeated over the plurality of flip-flop circuits 34(1)-34(n) with the data input (D) of a last flip-flop circuit 34(n) coupled to the data output (Q) of the next to last flip-flop circuit. The value n can be any integer greater than or equal to 2. In an embodiment, n=4 as shown in FIG. 2.

The FIR DAC 30 further includes a plurality of single bit digital-to-analog converter (DAC) elements 36(1)-36(n). The input of each DAC element 36 is coupled to receive the data output (Q) of a corresponding flip-flop circuit 34(1)-34(n). Thus, the input of the first DAC element 36(1) receives the digital bit from the data output (Q) of the first flip-flop circuit 34(1), and so on. In this implementation, each single bit DAC element 36, for example, be implemented as a digitally controlled unit element current source.

The outputs from the DAC elements 36(1)-36(n) are summed at a summing junction 38 to generate the analog feedback signal D.

Figure 3:
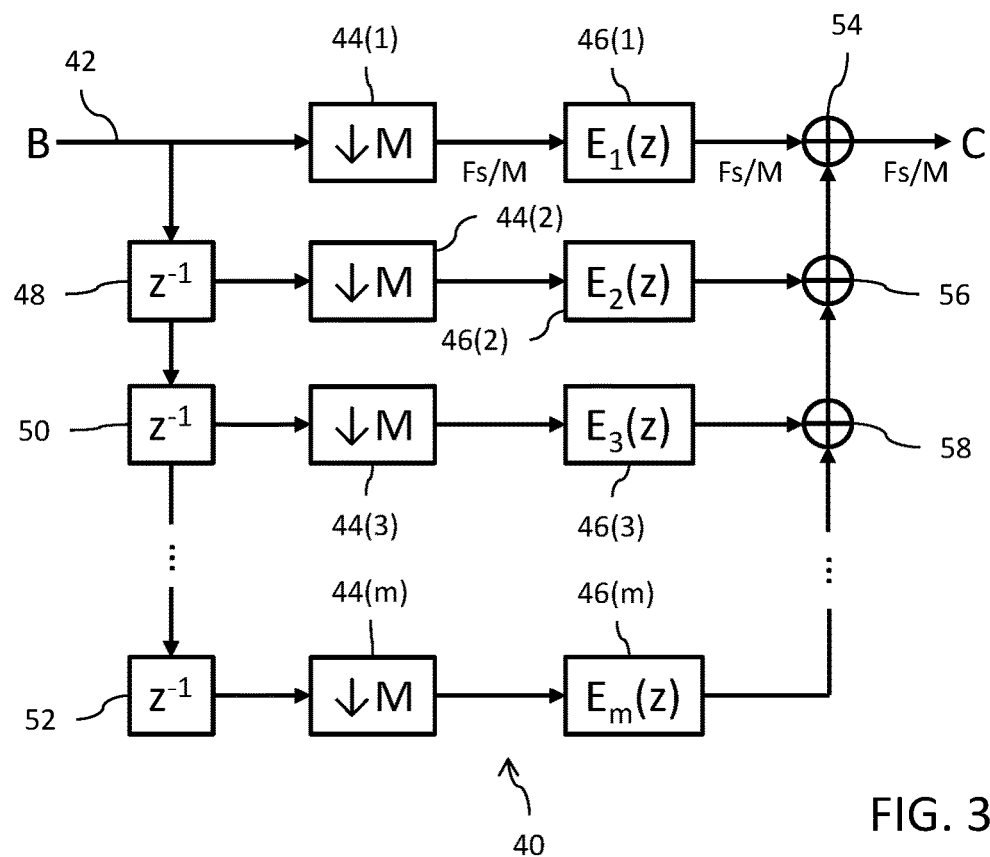
FIG. 3 is a block diagram of a digital filter for the circuit of FIG. 1.

Reference is now made to FIG. 3 which shows a block diagram of an m bank polyphase filter 40 for use as the digital filter circuit 14 the circuit shown in FIG. 1. The value m can be any integer greater than or equal to 2. In an embodiment, m=4 or 6 or 8 or 10. The filter 40 includes an input 42 configured to receive the sequence of bits of the digital output signal B from the quantizer circuit 24. In a first signal processing path, the bits of the digital output signal B are decimated by a factor of M using a decimation circuit 44(1) with the K bits of the decimated signal processed through a first polyphase filter bank 46(1) with a transfer function of $E_1(z)$ to generate bits at a rate of fs/M. The digital output signal B is further delayed by one cycle of the sampling clock in a delay circuit 48, and then processed in a second signal processing path including a decimation by the factor of M using a decimation circuit 44(2) with the bits of the decimated signal processed through a second polyphase filter bank 46(2) with a transfer function of $E_2(z)$ to generate bits at a rate of fs/M. The delayed signal is then further delayed by one cycle of the sampling clock in a delay circuit 50, and then processed in a third signal processing path including a decimation by a factor of M using a decimation circuit 44(3) with the bits of the decimated signal processed through a third polyphase filter bank 46(3) with a transfer function of $E_3(z)$ to generate bits at a rate of fs/M. This arrangement is repeated as necessary in accordance with the stage order of the filter until the m-th stage where delay circuit 52 applies a delay of one cycle of the sampling clock, and the delayed signal is processed in the m-th signal processing path including a decimation by the factor of M using a decimation circuit 44(m) with the bits of the decimated signal processed through an m-th polyphase filter bank 46(m) with a transfer function of $E_m(z)$ to generate bits at a rate of fs/M. The outputs of the m polyphase filter banks 46 are summed by summing circuits 54, 56, 58 to generate the bits of the digital signal C at a rate of fs/M. The operation and configuration of the polyphase decimation filter 40 is well known to those skilled in the art.

It will be noted that the signal interfaces for the digital output signal B from the quantizer circuit 24 to the single bit DAC circuit 26 and the digital filter circuit 14 are each high speed interfaces having to operate at the sampling rate fs for the sampling clock. Because of this, there is a significant digital design complexity and power consumption. There would be an advantage to address these concerns.

Figure 4:
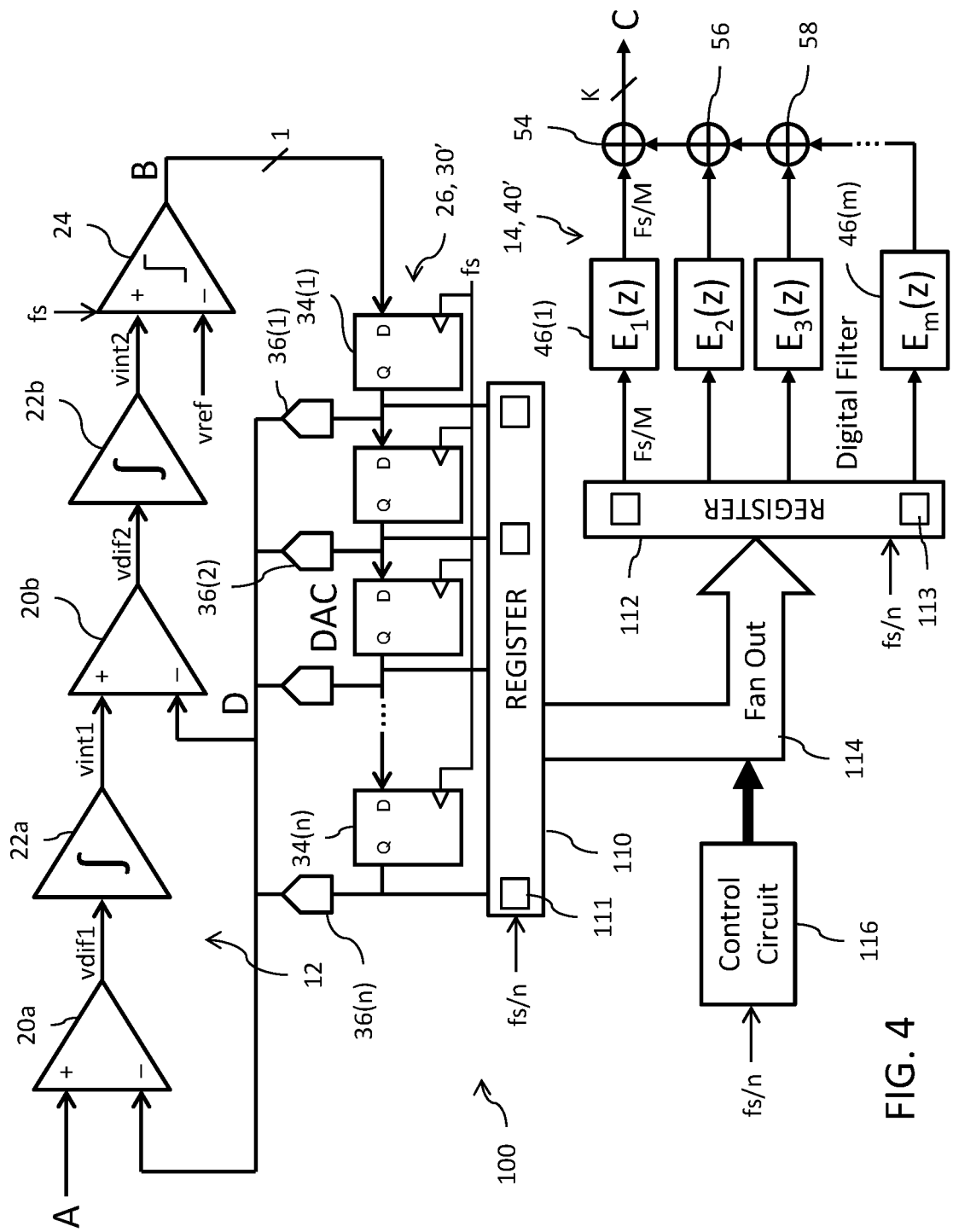
FIG. 4 is a block diagram of an alternate embodiment for a sigma-delta analog-to-digital converter circuit with single bit quantization.

Reference is now made to FIG. 4 which shows a block diagram of an alternate embodiment for a sigma-delta analog-to-digital converter circuit 100. Like references in FIGS. 1, 2, 3 and 4 refer to like, similar or same components. The circuit 100 of FIG. 4 differs from the circuit 10 of FIGS. 1, 2 and 3 mainly in terms of how the sequence of bits of the digital output signal B from the quantizer circuit 24 are passed to the digital filter circuit 14. The single bit finite impulse response (FIR) digital-to-analog converter (DAC) circuit 30' for use as the single bit DAC circuit 26 the circuit of FIG. 4 further includes a clocked data register 110. The data outputs (Q) from the flip-flops 34(1)-34(n) are applied to the inputs of the corresponding single bit DAC elements 36(1)-36(n) and also to the n singe bit inputs for the bit storage locations 111 of the clocked data register 110. The data register 110 operates in response to each assertion of the input clock signal to latch the data outputs (Q) from the flip-flops 34 in the locations 111. The input clock signal for the data register 110 operates to latch data at a frequency of fs/n (where n is equal to the number of flip-flops 34). Thus, the data register 110 will store one n-bit word (or frame) comprising n consecutive bits of the digital output signal B at a rate corresponding to the frequency fs/n. The m bank polyphase filter 40' for use as the digital filter circuit 14 of the circuit of FIG. 4 further includes a data register 112. The data register 112 includes m-bit locations 113 (where m is equal to the number of signal processing paths in the polyphase filter 40'). In this configuration, each signal processing path includes a polyphase bank 46. A controlled fan out circuit 114 operates to distribute each word (or frame) of n bits output from the data register 110 to the m inputs of the data register 112 using a demultiplexing switching operation implementing a parallel data shifting operation. It will be noted that there is no need for inclusion of a decimation circuit (like circuit 44) in each signal processing path because the operation of the registers 110, 112 and fan out circuit 114 performs a decimation function. A control circuit 116, operating responsive to the input clock signal at the frequency fs/n, controls the demultiplexing switching operation of the fan out circuit 114 to deliver each n bit word (or frame) of data bits from the data register 110 to n locations 113 in the m-bit data register 112. The data bits stored in the data register 112 are then output to the corresponding signal processing paths of the polyphase filter 40'.

In an embodiment, n=M such that the setting of the decimation rate corresponds to the bit size of the registers and flip flops. It will be noted, however, that n may be different from M. In such a case, the fan out circuit 114 and the control circuit 116 are designed re-frame (i.e., rearrange) the n-bits output from the flip flops into an M-bit wide word that will be useable by the decimate by M digital filter operating at a rate corresponding to fs/M.

In an embodiment, n=m and thus the controlled fan out circuit 114 simply operates as parallel shift circuit to transfer the data word including n-bits from the data register 110 to the corresponding m-bits of the data register 112. This word shift is performed at a rate corresponding to the frequency fs/n.

In another embodiment, n<m and thus the operation of the controlled fan out circuit 114 is more complicated. As an example of this more complicated operation, the controlled fan out circuit 114 implements a barrel shifting function for transferring each word including n-bits from the data register 110 to certain bit locations of the m-bits of the data register 112. This barrel shift is performed at a rate corresponding to the frequency fs/n.

A better understanding of the barrel shifting function may be obtained through the consideration of a specific example where n=4 and m=6. At a given pulse of the input clock signal (at the frequency fs/n), the control circuit 116 controls the demultiplexing switching operation of the fan out circuit 114 to deliver a data word (or frame) including 4 data bits from the data register 110 to the first four bit locations (i.e., bits 1 to 4) in the data register 112. At a next (subsequent) pulse of the input clock signal (at the frequency fs/n), the control circuit 116 controls the demultiplexing switching operation of the fan out circuit 114 to deliver the next data word (or frame) of 4 data bits from the data register 110 to the last two (i.e., bits 5 to 6) and first two (i.e., bits 1 to 2) bit locations in the data register 112 (illustrating the barrel shifting operation). At the following pulse of the input clock signal (at the frequency fs/n), the control circuit 116 controls the demultiplexing switching operation of the fan out circuit 114 to deliver the following data word (or frame) including 4 data bits from the data register 110 to the last four bit locations (i.e., bits 3 to 6) in the data register 112.

Consider now a specific example where n=4 and m=10. At a given pulse of the input clock signal (at the frequency fs/n), the control circuit 116 controls the demultiplexing switching operation of the fan out circuit 114 to deliver the data word (or frame) including 4 data bits from the data register 110 to the first four bit locations (i.e., bits 1 to 4) in the data register 112. At a next (subsequent) pulse of the input clock signal (at the frequency fs/n), the control circuit 116 controls the demultiplexing switching operation of the fan out circuit 114 to deliver the next data word (or frame) including 4 data bits from the data register 110 to the second four locations (i.e., bits 5 to 8) in the data register 112. At the following pulse of the input clock signal (at the frequency fs/n), the control circuit 116 controls the demultiplexing switching operation of the fan out circuit 114 to deliver the following data word (or frame) including 4 data bits from the data register 110 to the last two (i.e., bits 9 to 10) and first two (i.e., bits 1 to 2) bit locations in the data register 112 (illustrating the barrel shifting operation).

Consider now a specific example where n=4 and m=8. At a given pulse of the input clock signal (at the frequency fs/n), the control circuit 116 controls the demultiplexing switching operation of the fan out circuit 114 to deliver the data word (or frame) including 4 data bits from the data register 110 to the first four bit locations (i.e., bits 1 to 4) in the data register 112. At a next (subsequent) pulse of the input clock signal (at the frequency fs/n), the control circuit 116 controls the demultiplexing switching operation of the fan out circuit 114 to deliver the next data word (or frame) including 4 data bits from the data register 110 to the last four locations (i.e., bits 5 to 8) in the data register 112. At the following pulse of the input clock signal (at the frequency fs/n), the control circuit 116 controls the demultiplexing switching operation of the fan out circuit 114 to deliver the following data word (or frame) including 4 data bits from the data register 110 to the first four bit locations (i.e., bits 1 to 4) in the data register 112 (illustrating the barrel shifting operation).

There is a considerable savings in power with the FIG. 4 circuit 100 implementation, as compared to the implementation of FIGS. 1-3, where the analog and digital resources of the circuit are shared by both the FIR DAC 30' and the polyphase filter 40'. The reuse of data latched by the flip-flops 34 of the FIR DAC 30' to provide the data for both the single bit DAC elements and the input to the decimation circuits 44 is advantageous as this data is generated at a rate corresponding to the frequency fs/n. Power reduction is achieved at least because high rate (i.e., corresponding to the sampling frequency fs) digital data registers, along with the associated clocking and control circuits, are not required.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A continuous time, sigma-delta analog-to-digital converter circuit, comprising:
   a sigma-delta modulator circuit configured to receive an analog input signal and including a single bit quantizer configured to generate a digital output signal at a sampling frequency and further including a single bit digital-to-analog converter (DAC) circuit configured to process the digital output signal to generate an analog feedback signal for comparison to the analog input signal;

wherein the single bit digital-to-analog converter circuit comprises:
a plurality of flip-flops coupled in series and configured to store bits of the digital output signal; and
a plurality of single DAC elements controlled by the stored bits of the digital output signal output from said plurality of flip-flops;

a polyphase filter circuit including a plurality of signal processing paths, wherein each signal processing path includes a polyphase filter bank and wherein outputs from the plurality of signal processing paths are summed to generate a converted output signal; and a fan out circuit configured to selectively apply bits of the digital output signal output from the plurality of flip-flops to inputs of the plurality of signal processing paths of the polyphase filter circuit.

2. The circuit of claim 1, further comprising:
a first register circuit configured to latch the stored bits of the digital output signal output from said plurality of flip-flops at a rate dependent on a clock frequency which is a fraction of the sampling frequency;
wherein inputs of the fan out circuit are coupled to outputs of the first register circuit; and
a second register circuit configured to store the selectively applied bits;
wherein inputs of the second register circuit are coupled to outputs of the fan out circuit and wherein outputs of the second register circuit are coupled to the plurality of signal processing paths of the polyphase filter circuit.

3. The circuit of claim 2, wherein said plurality of flip-flops comprises n flip-flops and wherein the clock frequency equals the sampling frequency divided by n.

4. The circuit of claim 3, wherein the plurality of signal processing paths comprises m signal processing paths.

5. The circuit of claim 4, wherein n=m.

6. The circuit of claim 4, wherein n<m.

7. The circuit of claim 6, wherein the fan out circuit applies the stored bits of the digital output signal latched in the first register circuit to select bits of the second register circuit using a barrel shifting function.

8. The circuit of claim 7, wherein the barrel shifting function is implemented at said rate dependent on the clock frequency.

9. The circuit of claim 2, wherein the stored bits of the digital output signal latched by the first register circuit form a data word; and wherein the fan out circuit applies data words for storage in the second register circuit using a barrel shifting function.

10. The circuit of claim 9, wherein the barrel shifting function is implemented at said rate dependent on the clock frequency.

11. The circuit of claim 1, wherein each single DAC element comprises a unit element current source controlled by a corresponding one of the stored bits of the digital output signal output from said plurality of flip-flops.

12. The circuit of claim 1, wherein the flip-flops of said plurality of flip-flops are each clocked at the sampling frequency.

13. A continuous time, sigma-delta analog-to-digital converter circuit, comprising:
a sigma-delta modulator circuit configured to receive an analog input signal and including:
a single bit quantizer configured to generate a digital output signal at a sampling frequency;
a data storage circuit configured to store bits of the digital output signal; and
a plurality of digital-to-analog converter (DAC) elements coupled to the data storage circuit and actuated in response to the stored bits to generate an analog feedback signal for comparison to the analog input signal;
a filter circuit including a plurality of polyphase signal processing paths and a summation circuit configured to sum outputs from the plurality of polyphase signal processing paths to generate a converted output signal; and
a fan out circuit configured to selectively apply the stored bits from the data storage circuit to inputs of the plurality of polyphase signal processing paths of the filter circuit.

14. The circuit of claim 13, wherein the data storage circuit comprises a plurality of flip-flops coupled in series and clocked at the sampling frequency.

15. The circuit of claim 14, wherein data outputs of the plurality of flip-flops control the plurality of DAC elements.

16. The circuit of claim 13, wherein the data storage circuit further comprises a register circuit configured to latch the stored bits of the digital output signal at a rate dependent on a clock frequency which is a fraction of the sampling frequency; and
wherein inputs of the fan out circuit are coupled to outputs of the register circuit.

17. The circuit of claim 16, wherein the fraction is dependent on a number of stored bits of the digital output signal.

18. The circuit of claim 16, further comprising a further register circuit configured to couple outputs of the fan out circuit to the plurality of polyphase signal processing paths of the filter circuit.

19. The circuit of claim 16, wherein the stored bits of the digital output signal latched by the first register circuit form a data word; and wherein the fan out circuit applies data words to the plurality of polyphase signal processing paths of the filter circuit using a barrel shifting function.

20. The circuit of claim 19, wherein the barrel shifting function is implemented at said rate dependent on the clock frequency.

* * * * *